US 6,473,996 B1

(12) United States Patent
Tokunaga

(10) Patent No.: US 6,473,996 B1
(45) Date of Patent: Nov. 5, 2002

(54) LOAD PORT SYSTEM FOR SUBSTRATE PROCESSING SYSTEM, AND METHOD OF PROCESSING SUBSTRATE

(75) Inventor: Kenji Tokunaga, Kanagawa (JP)

(73) Assignee: Semiconductor Leading Edge Technologies, Inc., Yokohama (JP)

( * ) Notice: Subject to any disclaimer, the term of this patent is extended or adjusted under 35 U.S.C. 154(b) by 0 days.

(21) Appl. No.: 09/697,174

(22) Filed: Oct. 27, 2000

(30) Foreign Application Priority Data

Nov. 25, 1999 (JP) .......................................... 11-334104

(51) Int. Cl.[7] ................................................ F26B 5/04
(52) U.S. Cl. ............................. 34/417; 34/487; 34/242; 414/217; 414/937; 414/940
(58) Field of Search .......................... 34/417, 443, 487, 34/236, 237, 203, 204, 242; 414/217, 225, 331, 416, 416.03, 416.08, 749.3, 937, 940

(56) References Cited

U.S. PATENT DOCUMENTS

| | | | | |
|---|---|---|---|---|
| 5,609,459 A | * | 3/1997 | Muka et al. ................. | 414/217 |
| 5,613,821 A | * | 3/1997 | Muka et al. ................. | 414/217 |
| 5,664,925 A | * | 9/1997 | Muka et al. ................. | 414/217 |
| 6,082,949 A | * | 7/2000 | Rosenquist ................. | 414/217 |
| 6,120,229 A | * | 9/2000 | Hofmeister ................. | 414/217 |

FOREIGN PATENT DOCUMENTS

JP          5-109865          4/1993

OTHER PUBLICATIONS

Patent Abstract of Japan, "Production of Magnetic Head", JP 10–124812, May 15, 1998, Japanese Patent Office.

* cited by examiner

*Primary Examiner*—Pamela Wilson
(74) *Attorney, Agent, or Firm*—Foley & Lardner

(57) ABSTRACT

In a load port mechanism of a substrate treatment unit, protuberances are provided on a sealing surface formed along a door with which a wafer carrier is to dock, or on a sealing surface formed around the door of the wafer carrier. The wafer carrier door is faced with the load port door with the protuberances therebetween, thereby separating the sealing surface of the substrate treatment unit from the sealing surface of the wafer carrier by only a predetermined distance. Thus, there is formed a channel along which clean air flows from the inside of the substrate treatment unit to the outside thereof. The load port structure and the wafer carrier structure improve the reliability of opening/closing action of the wafer carrier and prevent entry of extraneous particles into the treatment unit with sufficient reliability, and enable high-yield production of integrated circuits.

13 Claims, 7 Drawing Sheets

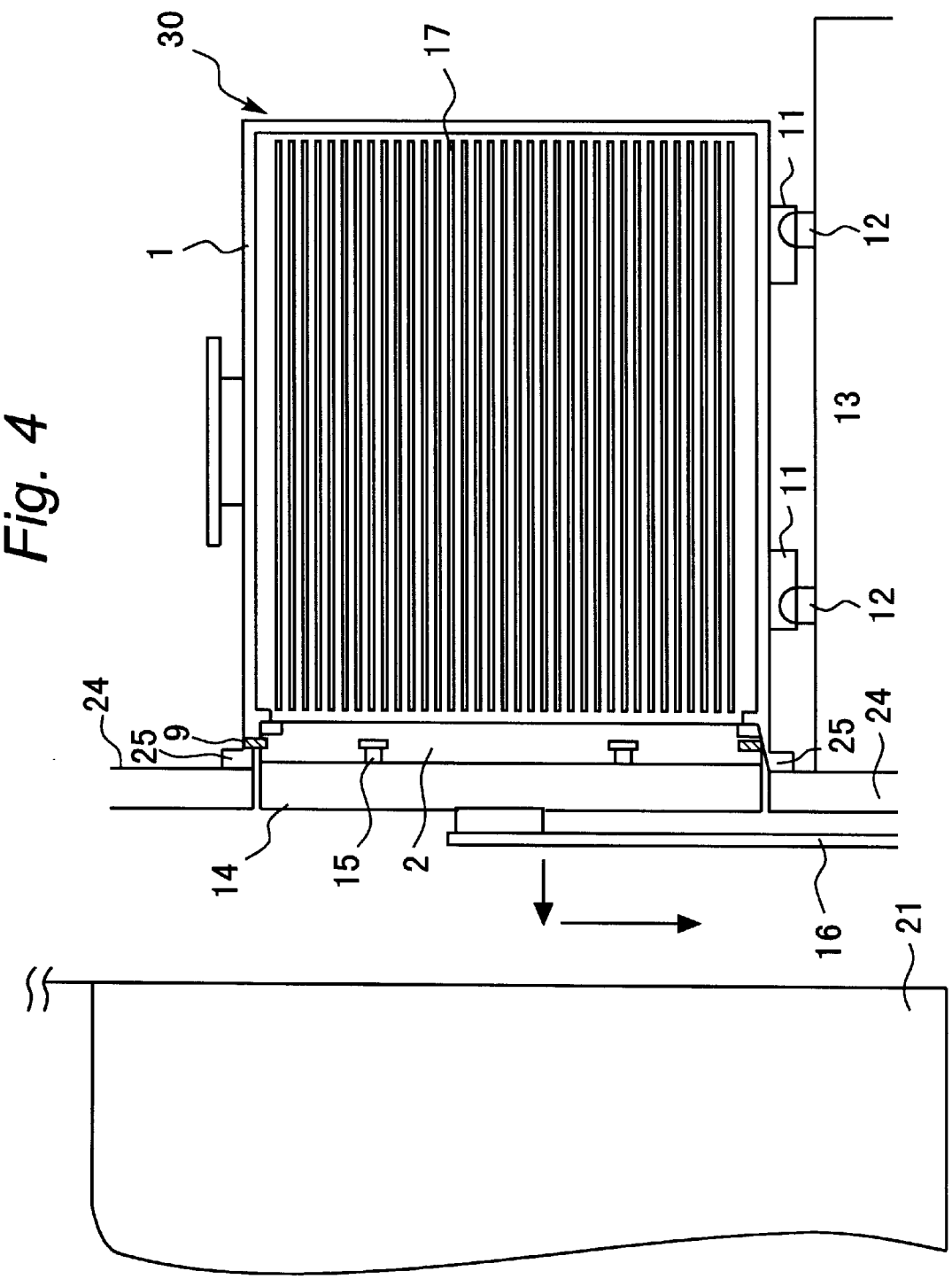

LOAD PORT SYSTEM FOR SUBSTRATE PROCESSING SYSTEM, AND METHOD OF PROCESSING SUBSTRATE

BACKGROUND OF THE INVENTION

1. Field of the Invention

The present invention relates to a Front Opening Unified Pod (FOUP), which is a next-generation wafer carrier for holding, transporting, and storing a substrate such as a semiconductor wafer. The present invention further relates to a load port for opening and closing the pod, to a load port system including the FOUP, and to a method of treating or producing a substrate using the load port system. More particularly, the present invention is intended to improve the reliability of opening/closing action of a door of a FOUP and prevent entry of particles (extraneous particles) into a substrate treatment unit with sufficient reliability.

2. Background Art

In contrast with open cassettes which have conventionally been used (e.g., open cassettes which are incompatible with 8-inch wafers and typified by SEMI Standard E1.9), a side-door integral-type wafer carrier holds wafers in an enclosed space, to thereby protect wafers from dust particles in the atmosphere or from chemical contamination.

FIG. 9 is a perspective view for describing a FOUP system which is a side-door integral-type wafer carrier and has conventionally been used for manufacturing semiconductor devices. As shown in FIG. 9, P30 denotes a FOUP system; P1 denotes a FOUP shell (e.g., a pod main unit); P2 denotes a FOUP door; P5 denotes a latch key hole; P8 denotes a sealing substance (e.g., a packing); P9 denotes a door clamping mechanism (e.g., a stopper mechanism); and P10 denotes a retainer.

The FOUP system P30 shown in FIG. 9 belongs to Front Opening Unified Pod systems, which are next-generation wafer carriers for holding, transporting, and storing substrates for use as photo-reticles, substrates for display panels such as substrates for liquid-crystal display panels or plasma displays, hard disk substrates, and substrates such as wafers for use in fabricating electronic devices such as semiconductor devices. The FOUP system P30 is one described in, for example, a catalog describing F300 Wafer Carriers manufactured by Entegris. Information about detailed dimensions of the FOUP system are described in SEMI Standards E57, E1.9, E47.1. Such a side-door integral-type wafer carrier is hereinafter generically called a "FOUP system."

In contrast with open cassettes which have conventionally been used (e.g., open cassettes which are incompatible with 8-inch wafers and typified by SEMI Standard E1.9), the conventional FOUP system holds wafers in an enclosed space, to thereby protect the wafers from dust particles in the atmosphere or from chemical contamination. In order to maintain air-tightness, the sealing substance P8 (packing) is provided along the edge of the FOUP door P2. The FOUP door P2 has a wafer press mechanism called the retainer P10, beams called a wafer teeth section (not shown) for seating wafers, and a mechanical opening/closing mechanism such as the door clamp mechanism P9.

In order to open and close such a FOUP system P30 in a semiconductor manufacturing system (e.g., a substrate treatment unit), there is a necessity for use of a load port having a FIMS (Front-Opening Interface Mechanical Standard) surface specified by a SEMI standard.

The load port has a kinematic pin for sustaining the FOUP system P30 in a fixed position, a FIMS door which engages with the FOUP door P2 and is taken into an mini-environment defined in the FOUP system 30 along with the FOUP door P2 after the FOUP door P2 has been opened (i.e., after a latch key has been rotated), and a housing surface for isolating the mini-environment from the outside. An area in the housing surface of the load port which is to engage with a FOUP sealing surface of the FOUP system P30 is called an FIMS sealing surface.

A wafer holding section of such a conventional wafer carrier (or FOUP system) P30 is primarily made up of the FOUP shell section P1 and the FOUP door P2 which is an open/close door. In order to secure the FOUP door P2 to the FOUP shell section P1, there is a necessity for the door clamping mechanism P9 (e.g., a stopper mechanism). For this reason, the wafer holding section has a complicated structure, and a hole must be provided in the FOUP door P2. Further, a hole to be clamped for securing a door must be provided even in the FOUP shell section P1. Further, the FOUP shell section P1 must have a thick section and a sealing section.

At worksites, a plurality of types of load ports and a plurality of types of wafer carrier jigs (FOUP systems) P30 must be used in combination. Accordingly, higher dimensional accuracy is required. Even minute deformation greatly affects the reliability of opening and closing action of a FOUP door.

The background art encounters the following problems. A first drawback of the background art is that, when the sealing substance P8 (i.e., a packing) provided on the sealing surface of the FOUP shell section P1 is brought into contact with the FIMS sealing surface, sustaining the FOUP system P30 in such a position and opening/closing the FOUP system P30 with high reliability are difficult.

A second problem is that, when the sealing surface of the FOUP shell section P1 remains in contact with the FIMS sealing surface, flow of clean air from the mini-environment defined in the treatment unit (i.e., the inside of the FOUP system P30) to the outside thereof is limited. This is not preferable in terms of contamination. Particularly, prevention of entry of particles (extraneous particles) into the treatment unit (the inside of the FOUP system P30) is insufficiently reliable.

SUMMARY OF THE INVENTION

The present invention has been conceived to solve these drawbacks of the background art and is aimed at providing a load port structure and a FOUP structure which enable high-yield production of integrated circuits by means of improving the reliability of opening/closing action of a FOUP door and preventing entry of particles into the treatment unit with sufficient reliability. Further, the present invention has been conceived to provide a production method using the improved load port structure and the FOUP structure.

According to the aspects of the present invention, a load port system for use with a substrate treatment unit is improved, in which a wafer carrier having wafers stored therein is placed on a load port of the substrate treatment unit, a load port door opposes a door of the wafer carrier, and a sealing surface provided around the load port door opposes a sealing surface provided around a door opening section of the wafer carrier.

In the load port system, a plurality of protuberances, which are to be brought into contact with the sealing surface provided around the door opening section of the wafer carrier, are provided on the sealing surface formed around the load port door of the substrate treatment unit.

Alternatively, a plurality of protuberances, which are to be brought into contact with the sealing surface provided around the load port door of the substrate treatment unit, are provided on the sealing surface formed around the door opening section of the wafer carrier.

Thereby, a predetermined clearance is maintained between the sealing surface provided around the load port door and the sealing surface provided around the door opening section of the wafer carrier.

Other features and advantages of the invention will be apparent from the following description taken in connection with the accompanying drawings.

BRIEF DESCRIPTION OF THE DRAWINGS

FIGS. 1 through 6 are illustrations for describing a preceding invention which serves as a foundation for the present invention.

FIG. 1 shows an external of a FOUP system according to a preceding invention.

FIG. 2 shows an interior structure of the. FOUP door of the FOUP system 30 shown in FIG. 1.

FIG. 4 shows a method of opening and closing the FOUP door of the FOUP system at a load port having an FIMS surface.

FIG. 5 shows a positional relationship of wafers and the wafer teeth section in the FOUP system.

FIG. 6 shows a perspective view of a production site for describing an automatic transfer method of the FOUP system among a substrate treatment units.

DETAILED DESCRIPTION OF THE PREFERRED EMBODIMENTS

First Embodiment

A first embodiment of the present invention will be described in detail herein below by reference to FIGS. 1 through 7.

FIGS. 1 through 6 are illustrations for describing a preceding invention which serves as a foundation for the present invention. FIG. 7 is an illustration for describing the structure of a first embodiment of the present invention which is based on the preceding invention.

Figure 1:
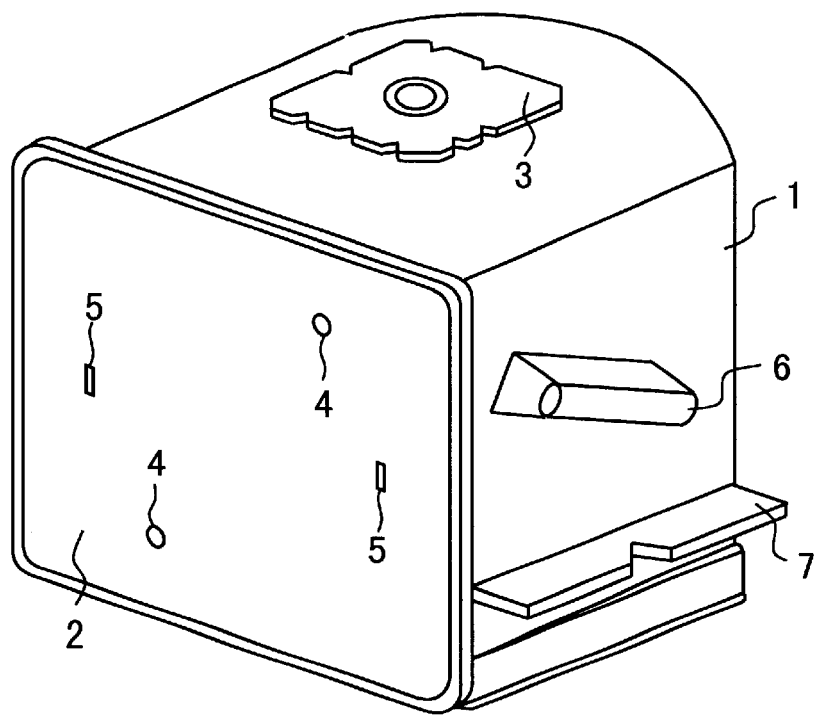

FIG. 1 is an external view for describing a FOUP shell section 1 of a FOUP system 30 (a side-door integral-type substrate housing jig) according to a preceding invention. As in FIG. 1, reference numeral 1 designates a FOUP shell section; 2 designates a FOUP door; 3 designates a mushroom; 4 designates a registration pin hole; 5 designates a latch key hole; 6 designates a manual handle; and 7 designates a side rail.

Figure 2:
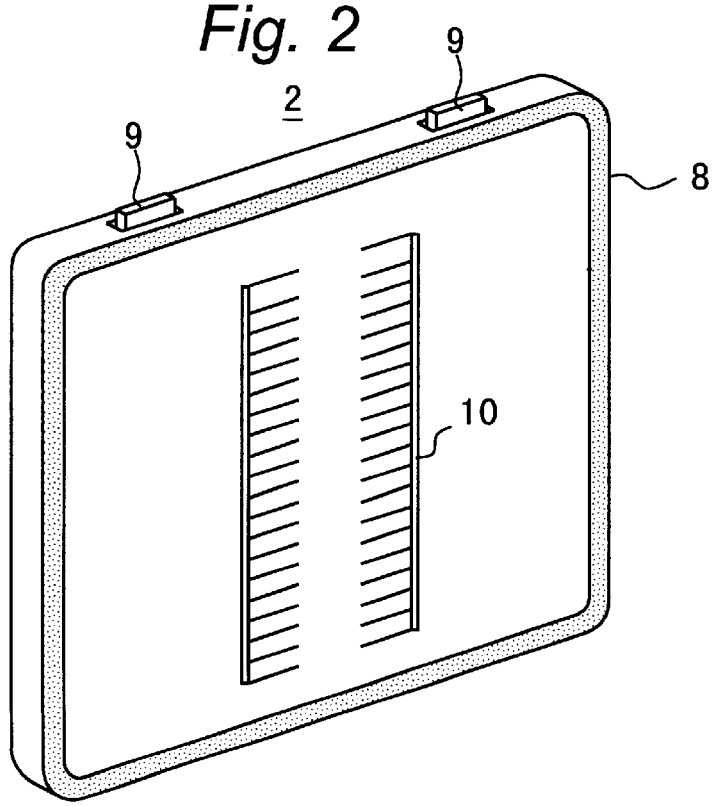

FIG. 2 shows the interior structure of the FOUP door 2 of the FOUP system 30 shown in FIG. 1. As shown in FIG. 2, reference numeral 2 designates the FOUP door; 8 designates a sealing substance (packing); 9 designates a door clamping mechanism; and 10 designates a retainer.

The FOUP system 30 (a side-door integral-type substrate housing jig) according to the preceding invention shown in FIGS. 1 and 2 is a housing jig for a substrate which can be used for substrates for photo-reticle, substrates for display panels such as substrates for liquid-crystal displays or plasma displays, and glass substrates, magnetic substrates, or resin substrates for use as substrates such as wafers for fabricating electronic devices such as semiconductor devices. The FOUP system 30 is primarily made up of the FOUP shell section 1 (see FIG. 1) and the FOUP door 2 (see FIG. 2).

As shown in FIG. 1, the FOUP shell section 1 comprises a FOUP shell section 1 which constitutes a pod main unit; a mushroom 3 to be grasped and hoisted up by an overhead hoist transfer section (OHT) 19 to be described later by reference to FIG. 6; registration pin holes 4 which enable sustaining of the FOUP system 30 in a position while registration pins protruding from the load port 13 to be described later are inserted into the registration pin holes 4; latch key holes 5 which enable opening and closing of the FOUP door 2 while latch keys 15 (i.e., a mechanical open/close mechanism) to be described later are inserted into the latch key holes 5; manual handles 6; side rails 7 for transporting the FOUP system 30; and a glass or plastic window (not shown).

The FOUP door 2 is primarily made of plastic or metal. As shown in FIG. 2, in order to ensure air-tightness, a sealing substance 8 (i.e., a packing) is provided along the edge of the FOUP door 2. Further, the FOUP door 2 has a door clamping mechanism 9 for mechanically opening and closing the FOUP door 2, and a retainer 10 for pressing a wafer (i.e., a substrate).

Figure 3A:
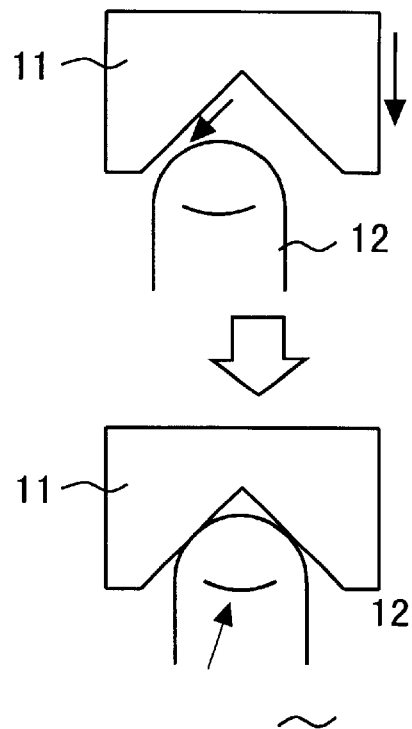
FIGS. 3A and 3B show a principle of positioning the FOUP system on the load port.
Figure 3B:
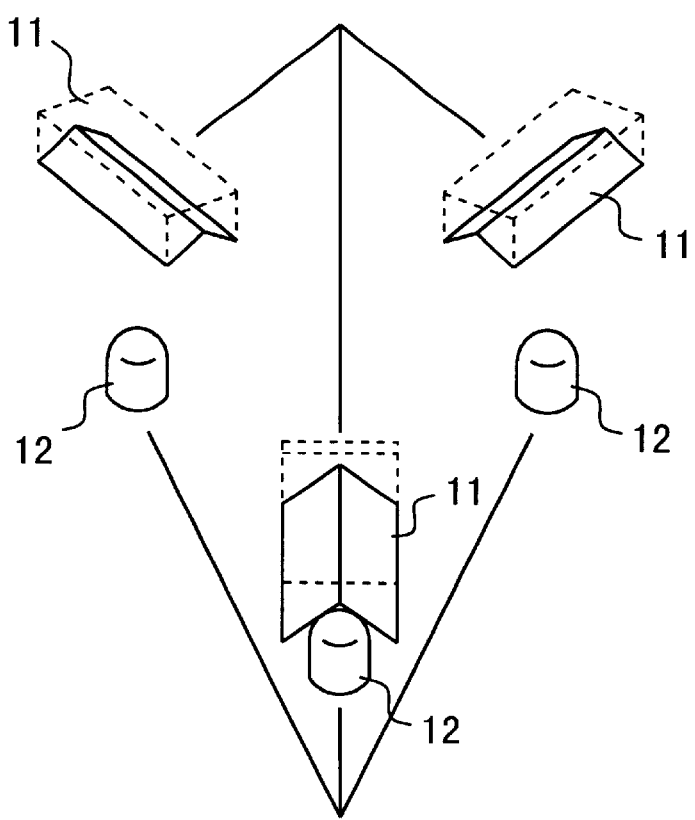

FIG. 3A is an illustration for describing the principle by which the FOUP system 30 is positioned on the load port 13 (see FIG. 4 to be described later). Specifically, the FOUP system 30 is positioned by means of V-shaped grooves 11 (not shown in FIG. 1) formed in the bottom of the FOUP system 30, and kinematic pins 12 (reference pins) provided on the upper surface of the load port 13 (see FIG. 4 to be described later). FIG. 3B shows the FOUP system 30 shown in FIG. 1 when the FOUP system 30 is positioned by means of the V-shaped grooves 11 and the kinematic pins 12 (reference pins).

As shown in FIGS. 3A and 3B, the V-shaped grooves 11 formed in the bottom of the FOUP shell section 1 are desirably made of primarily resin or are coated primarily with resin. The kinematic pins 12 (reference pins) provided on the upper surface of the load port 13 to be described later (see FIG. 4 to be described later) are made primarily of metal.

FIG. 4 is a schematic representation showing a method of opening and closing the FOUP door 2 of the FOUP system 30 at a load port having an FIMS surface. As has been described previously, the term FIMS is an abbreviation of Front-Opening Interface Mechanical Standard.

In FIG. 4, reference numeral 1 designates a FOUP shell section; 2 designates a FOUP door; 9 designates a door clamping mechanism; 11 designates V-shaped grooves; 12 designates kinematic pins (reference pins); 13 designates a load port; 14 designates a load port door; 15 designates a latch key; 16 designates a load port door open/close mechanism; 17 designates a wafer; 21 designates a treatment unit; 24 designates a FIMS sealing surface; 25 designates a FOUP sealing surface; and 30 designates a FOUP system (a side-door integral-type substrate housing jig).

The wafer 17 may be one of substrates for photo-reticle, substrates for display panels such as substrates for liquid-crystal displays or plasma displays, and glass substrates, magnetic substrates, or resin substrates for use as substrates such as wafers for fabricating electronic devices such as semiconductor devices. More specifically, the wafer 17 is a silicon (Si) wafer of the 300 mm diameter class.

The FOUP shell section 1 can hold a plurality of wafers 17 while separating them from each other by predetermined pitches. The kinematic pins (reference pints) 12 are provided on the upper surface of the load port 13. The load port door 14 is an entrance for transporting the FOUP door 2 and the wafers 17 from the load port 13 to the inside of the treatment unit 21. While the FIMS sealing surface 24 remains in contact with the FOUP sealing surface 25, the load port door 14 can be opened/closed (moved in a vertical direction in the drawing) by means of the load port door open/close mechanism 16.

The latch keys 15 are provided on the surface of the load port door 14. While the latch keys 15 are inserted into the latch key holes 5 (see FIG. 1) for opening/closing the FOUP door 2, the latch keys 15 are used for opening and closing the FOUP door 2.

The substrate treatment unit 21 signifies a cleaning system, a drying system, an etching system, a CVD system (chemical vapor-phase epitaxial growth thin-film formation system); a sputtering system (vacuum discharge gas thin-film formation system); a display panel manufacturing system typified by a heat treatment furnace; a system for manufacturing a magnetic storage medium such as a hard disk; a system for manufacturing a magneto-optical storage medium such as a magneto-optical (MO) disk, a photo disk (PD), a compact disk (CD), or a digital video disk (DVD); or an electronic device manufacturing system for manufacturing an LSI (an integrated circuit device).

Figure 5:
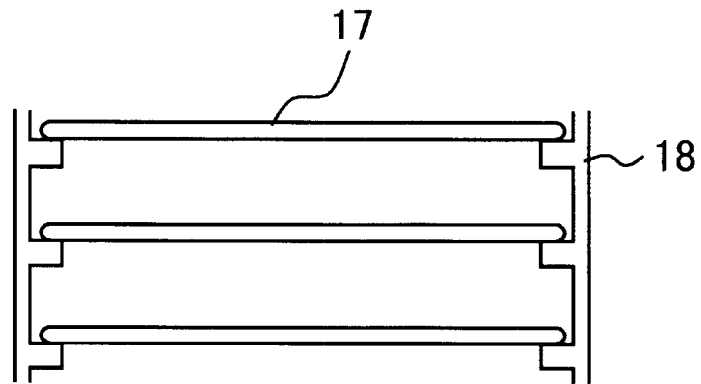

FIG. 5 shows the positional relationship between the wafers (substrates) 17 and the wafer teeth section 18. The wafer teeth section 18 shown in FIG. 5 is desirably made primarily of heat-resistant resin (PEEK or the like) or coated with heat-resistant resin (PEEK or the like). The wafer teeth section 18 has a shelf-like structure, in which protuberances are provided on a wall surface at predetermined intervals. A wafer 17 is placed so as to straddle the upper surfaces of a pair of protuberances. Since the protuberances are provided on the wall surface at given intervals, a plurality of wafers 17 can be stored in the wafer teeth section 18 so as to be spaced from each other at only given intervals.

Figure 6:
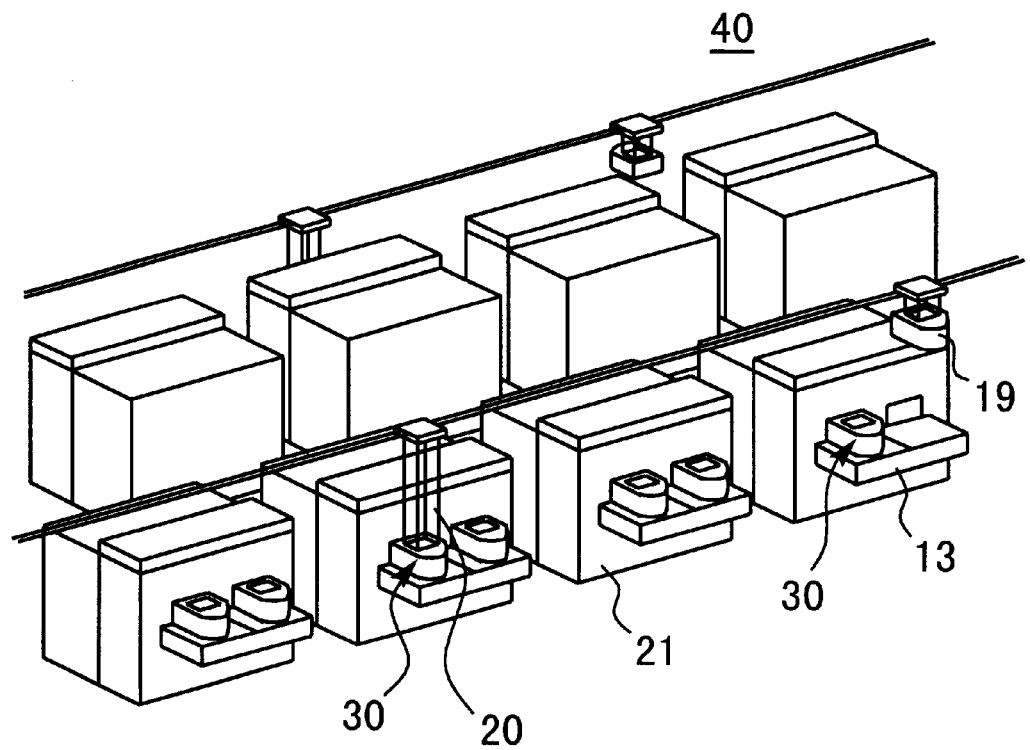
Figure 7:
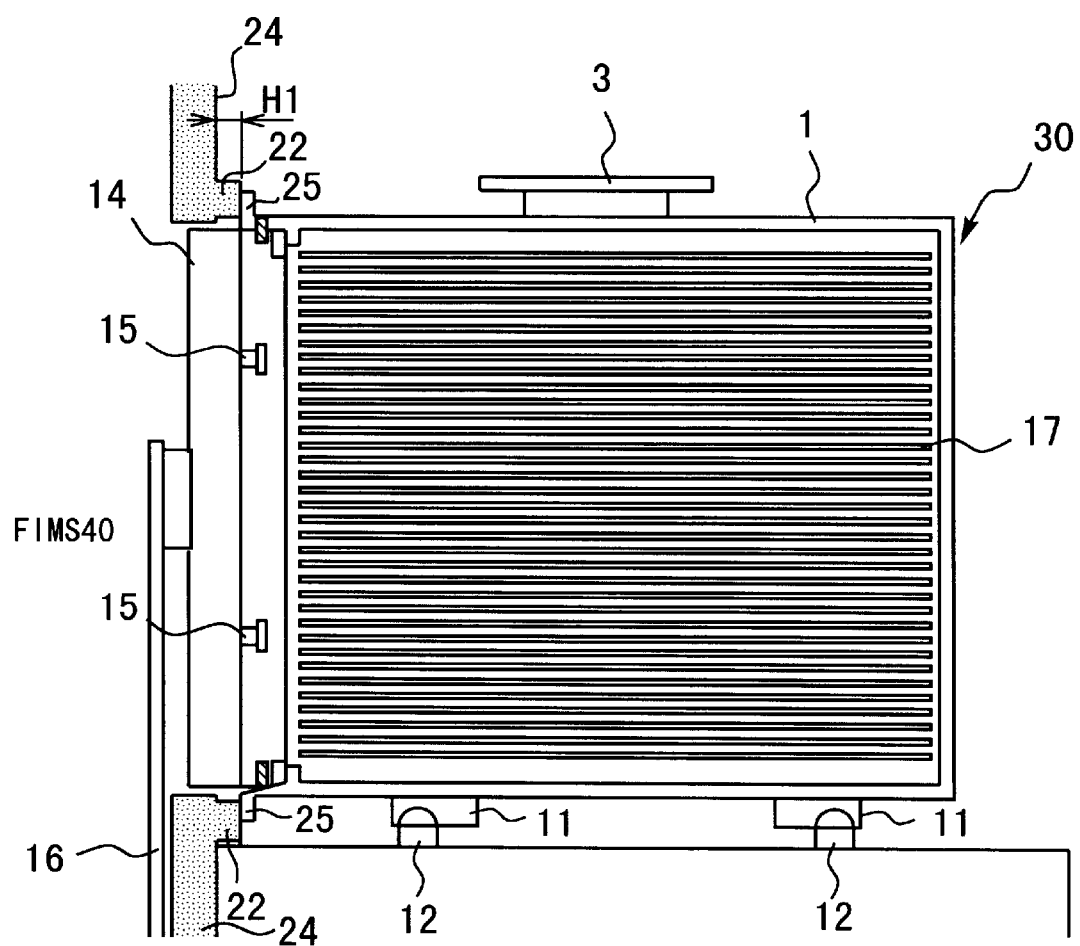
FIG. 7 shows a wafer carrier and a load port system for use with a substrate treatment unit according to a first embodiment of the present invention.

FIG. 6 is a schematic representation for describing an automatic transfer method for use with the FOUP system 30 set up at a production site at which a plurality of substrate treatment units are installed. More specifically, there is illustrated an automatic transfer mechanism for the FOUP system 30, which is embodied as an overhead hoist transfer (OHT).

As shown in FIG. 6, reference numeral 13 designates a load port; 19 designates an OHT section; 20 designates a hoist mechanism; 21 designates a substrate treatment unit; and 30 designates a FOUP system. The load port 13 has an FIMS structure.

The OHT section 19 in FIG. 6 is a typical automatic transfer machine for use with the FOUP system 30 installed in a bay of a semiconductor factory. Each of the plurality of treatment units 21 arranged in a line is provided with the load port 13. The FOUP system 30 which is transferred by use of the hoist mechanism 20 is to be placed on the load port 13.

Next, a method of transporting a wafer carrier will be described by reference to the corresponding drawings. In a semiconductor factory, the wafers (substrates) 17 to be subjected to various types of treatment are transported from one treatment system 21 to another while being stored in the FOUP system 30 (a side-door integral-type storage jig). The FOUP system 30 having the wafers (substrates) 17 of the 300 mm diameter class stored therein has a weight of 8 kg or more. In terms of safety, manual transportation of the FOUP system 30 is unthinkable, and the automatic transfer machine, such as the OHT section 19, is used for transporting the FOUP system 30.

In the example shown in FIG. 6, the FOUP system 30 having the wafers (substrates) 17 to be treated stored therein is transported, to the treatment unit 21 (e.g., an etching system shown in FIG. 6), from a cabinet provided in the course of manufacturing processes, by means of the OHT section 19 (see FIG. 6).

The FOUP system 30 is lowered onto and placed in a predetermined position (mount position) on the load port 13 of the treatment unit 21, by use of the hoist mechanism 20 (see FIG. 6). The V-shaped grooves 11 formed in the lower surface of the FOUP system 30 are guided to the kinematic pins (reference pins) 12 provided on the load port 13 and placed at predetermined locations (see FIG. 3).

The hoist mechanism 20 is disengaged from the FOUP system 30, and the FOUP system 30 is left on the load port 13. Subsequently, the FOUP system 30 is moved forward until it is docked with the load port door 14 (see FIG. 4).

Next, the latch-keys 15 (see FIG. 4) are rotated, to thereby disengage the FOUP door 2 from the door clamping mechanism 9. The FOUP door 2 is secured to the load port door 14.

The load port door open/close mechanism 16 is actuated, to thereby remove the FOUP door 2 from the FOUP shell section 1. The FOUP door 2 is moved to a lower inner portion of the treatment unit 21. While the FOUP door 2 is opened, the wafers (substrates) 17 are taken out of the FOUP system 30. The wafers (substrates) 17 are transported to a treatment section (not shown) provided within the treatment unit 21, by means of a wafer transport robot (not shown) provided in the treatment unit 21, wherein the wafers are subjected to predetermined treatment.

After having been subjected to treatment, the wafers (substrates) 17 are returned to the FOUP system 30 by means of the wafer transport robot. As mentioned above, after the wafers (substrates) 17 stored in the FOUP system 30 have been subjected to predetermined treatment, the load port door open/close mechanism 16 is actuated, to thereby dock the FOUP door 2 with the FOUP shell section 1. The latch-keys 15 are rotated, to thereby activate the door clamping mechanism 9. Thereby, the FOUP door 2 is secured to the FOUP shell section 1.

Subsequently, the FOUP system 30 is moved rearward to a mount position. In response to a transport request, a vacant OHT section 19 is stopped at a position on the load port 13; that is, the load port 13 having placed thereon the FOUP system 30 which is an object of transportation. The mushroom 3 is gripped and pulled up through use of a robot hand (not shown) of the hoist mechanism 20.

The FOUP system 30 is transported to the cabinet through use of the OHT section 19 and is temporarily stored in the cabinet. In the next processing process (for example, an ashing process or the like), the FOUP system 30 is transported. Through iteration of such a processing flow, a desired circuit is formed on each of the wafers (substrates) 17.

In the previous description, the OHT section 19 is used as an automatic transport mechanism. However, the present invention is not particularly limited to such a construction.

An automated guided vehicle (AGV) or a rail-guided vehicle (RGV) may be used as an automatic transport mechanism. Alternatively, a person-guided vehicle (PGV) may be used for manually transporting the FOUP system 30.

The preceding invention on which the present invention is based has been described in the above.

Next will be described a load port system for use with a substrate treatment unit according to a first embodiment of the present invention whose improvement is based on the foregoing preceding invention.

FIG. 7 is an illustration for describing a load port system of a substrate treatment unit according to a first embodiment of the present invention. FIG. 7 is a cross-sectional view showing a substrate treatment unit, in which a plurality of projections are formed on an improved FIMS surface; that is, a sealing surface 24 (a FIMS sealing surface) provided along the load port door 14 of the treatment unit 21. The FOUP system 30 (a side-door integral-type storage jig) is placed on the load port 13. FIG. 7 also shows opening/closing of the FOUP door 2. As shown in FIG. 7, reference numeral 22 designates a protuberance provided along the load port door 14 of the substrate treatment unit 21; that is, a FIMS sealing surface.

As shown in FIG. 7, in addition to the structure of the FOUP system of the background art, the FOUP system 30 according to the present embodiment has the protuberance 22 of height $H_1$ provided on the FIMS sealing surface 24. The height $H_1$ is for separating the FOUP sealing surface 25 of the FOUP system 30, on which the sealing substance 8 (packing) of the FOUP shell section 1 is provided, from the FIMS sealing surface 24 by only a predetermined distance. As a result, flow of clean air from an mini-environment defined in the treatment unit 21 (or the inside of a FIMS 40) to the outside thereof (i.e., the outside of the FIMS 40) is ensured.

When the FOUP sealing surface 25 of the FOUP shell section 1 is brought into contact with the protuberance 22 provided on the FIMS sealing surface 24, the FOUP system 30 can be held in that position. Consequently, the FOUP sealing surface 25 can be accurately positioned on the FIMS sealing surface 24 by way of the protuberance 22. At least one protuberance 22 is provided, and three to four or more protuberances 22 are usually provided on the FIMS sealing surface 24.

More specifically, a plurality of protuberances 22, each having a height $H_1$ of about 0.5 to 3.0 mm, are provided on the FIMS sealing surface 24 such that the crests of the protuberances 22 oppose the FOUP system 30. The FOUP sealing surface 25 of the FOUP shell section 1 is brought into contact with the protuberances 22 (having a height $H_1$), and the FOUP system 30 is held stationary at that position. In the area of the FOUP system 30 where the protuberance 22 is not present, the distance between the FIMS sealing surface 24 and the FOUP sealing surface 25 of the FOUP shell section 1 can be maintained to about 0.5 mm to 3.0 mm, which is equal to the height $H_1$ of the protuberances 22.

In the present embodiment, there may be realized a load port structure in which a contact switch may be provided on at least one of the protuberances 22 (having a thickness $H_1$) provided on the FIMS sealing surface 24. When the FOUP system 30 comes into contact with the contact switch provided on the protuberance 22 of the FIMS sealing surface 24, the resultant contact state is detected on the basis of a signal output from the contact switch, to thereby control docking action of the FOUP system 30; that is, docking of the FOUP sealing surface 25 of the FOUP system 30 with the protuberances 22 (having a height $H_1$) provided on the FIMS sealing surface 24.

There is embodied a load port structure, in which the protuberance 22 (having a height $H_1$) formed on the FIMS sealing surface 24 is constructed so as to ensure flow of clean air from the mini-environment defined in the treatment unit 21 (the inside of the FIMS 40) to the outside thereof (the outside of the FIMS 40). More specifically, the FOUP system 30 is stopped at a position in which the protuberances 22 provided on the FOUP sealing surface 25 of the FOUP shell section 1 are in contact with the FIMS sealing surface 24. Thus, the FOUP system 30 can be stopped repeatedly at the same position with highly precision, and hence the opening/closing of the FOUP door 2 can be controlled with high reliability.

At a position in which the FOUP system 30 is held stationary, a given clearance (0.5 mm to 3.0 mm) which is equal to the height $H_1$ of the protuberances 22 provided on the FIMS sealing surface 24 can be ensured between the FOUP sealing surface 25 of the FOUP shell section 1 and the FIMS sealing surface 24, with the exception of the area where the protuberances 22 are in contact with the FIMS sealing surface 24.

Thus, flow of clean air from the mini-environment defined within the treatment unit 21 (the inside of the FIMS 40) to the outside thereof (the outside of the FIMS 40) is not limited. Consequently, entry of particles (extraneous particles) into the FIMS 40 can be prevented with sufficient reliability. By means of use of such a load port system employing the load port 13 and the FOUP system 30, there can be fulfilled a highly-reliable low-contamination production method for use with a system of manufacturing a semiconductor device.

As mentioned previously, in the present embodiment, there is provided a load port system for use with a substrate treatment unit, in which a plurality of protuberances to be brought into contact with a sealing surface provided around a door opening section of a wafer carrier, such as a FOUP, are provided on a sealing surface laid around the load port door of the substrate treatment unit.

According to the present embodiment, the following advantages are yielded. A first advantage is that the reliability of opening/closing action of the FOUP door 2 can be improved by means of providing the protuberances 22 (having a height $H_1$) on the FIMS sealing surface 24.

A second advantage is that, so long as there is embodied a load port structure, in which clean air is blown from the inside of the treatment unit 21 (the FIMS 40) to the FOUP system 30 by way of a clearance between the FIMS sealing surface 24 and the FOUP sealing surface 25, entry of particles (extraneous particles) into the treatment unit 21 (the inside of the FIMS 40) can be prevented with sufficient reliability. Consequently, integrated circuits can be produced at high yield.

Second Embodiment

A second embodiment of the present invention will be described in detail by reference to the accompanying drawings. Those elements which are the same as those previously described in the first embodiment are assigned the same reference numerals, and repetition of their explanations is omitted.

Figure 8:
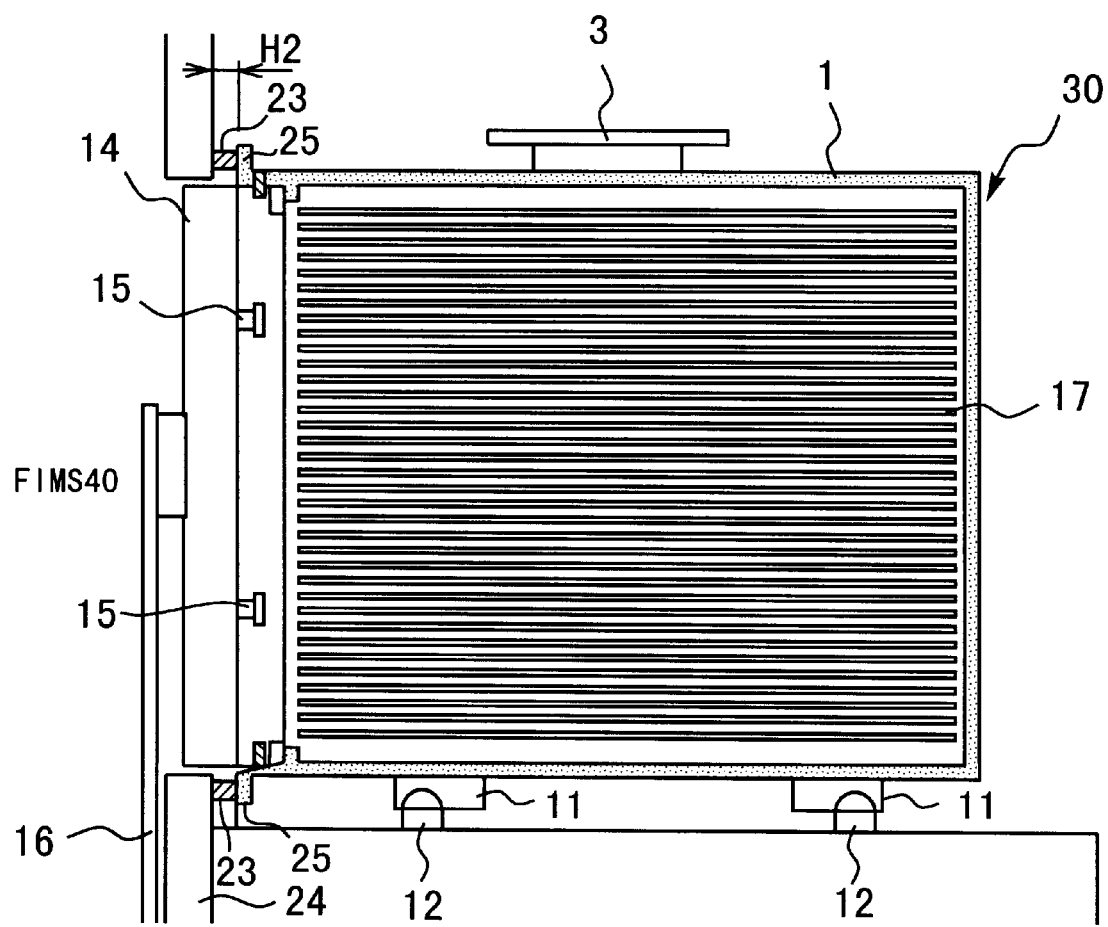
FIG. 8 shows a wafer carrier and a load port system for use with a substrate treatment unit according to a second embodiment of the present invention.
Figure 9:
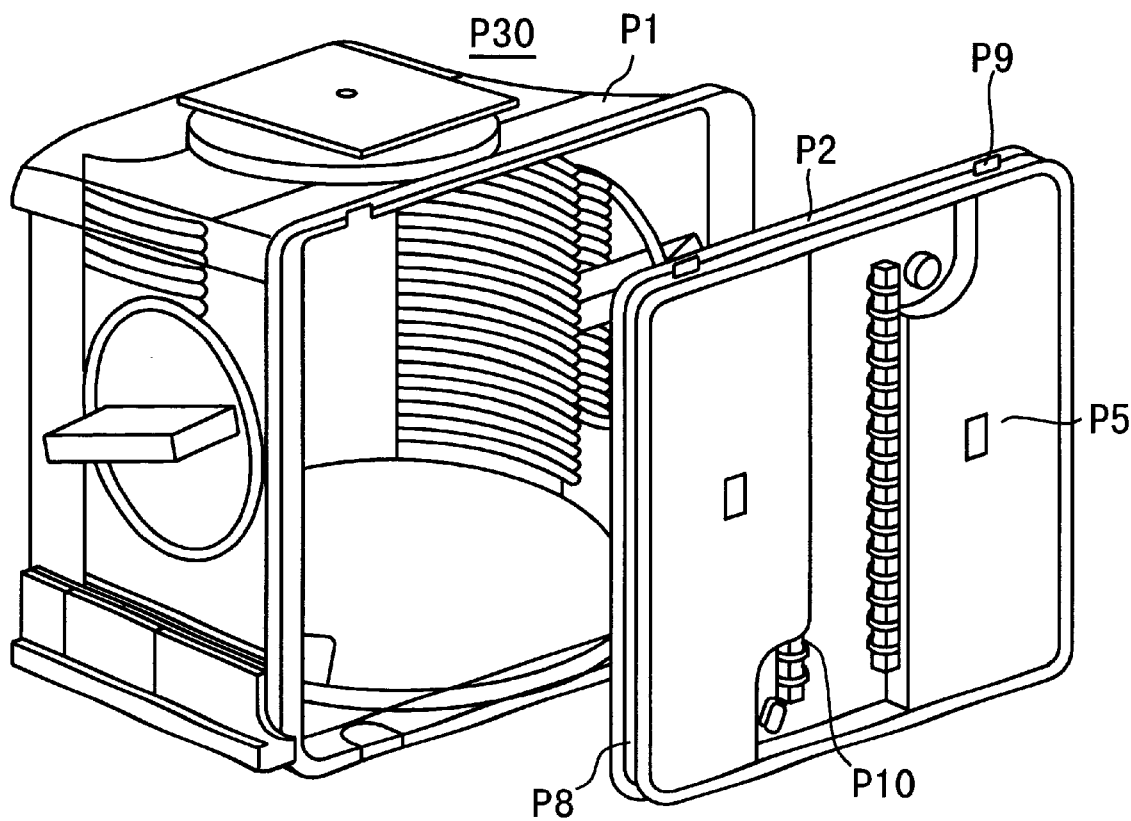
FIG. 9 is a perspective view of a conventional wafer carrier called Front Opening Unified Pod system.

FIG. 8 is a drawing for describing a load port system for use with a substrate treatment unit according to the second embodiment of the present invention. More specifically, FIG. 8 is a cross-sectional view showing a substrate treatment unit, in which the improved FOUP system 30 (a side-door integral-type storage jig) is placed on the load port 13 having a FIMS surface. FIG. 8 also shows a method of opening and closing the FOUP door 2.

As shown in FIG. 8, reference numeral 23 designates protuberances provided on a sealing surface laid along the edge of the FOUP door 2 of the FOUP system 30; that is, a FOUP sealing surface.

As shown in FIG. 8, in addition to the structure of the FOUP system of the background art, the FOUP system 30 according to the present embodiment has one or more protuberances 23 of height $H_2$ provided on the FOUP sealing surface 25. The height $H_2$ is for separating the FOUP sealing surface 25, on which the sealing substance 8 (packing) of the FOUP shell section 1 is provided, from the FIMS sealing surface 24 by only a predetermined distance. As a result, flow of clean air from an mini-environment defined within the treatment unit 21 (or the inside of a FIMS 40) to the outside thereof (i.e., the outside of the FIMS 40) is ensured.

When the protuberance 23 (having a height $H_2$) provided on the FOUP sealing surface 25 is brought into contact with the FIMS sealing surface 24, the FOUP system 30 can be held in that position. Consequently, the FOUP sealing surface 25 can be accurately positioned on the FIMS sealing surface 24 by way of the protuberance(s) 23. At least one protuberance 23 is provided, and three to four or more protuberances 23 are usually provided on the FIMS sealing surface 24.

More specifically, a plurality of protuberances 23, each having a height $H_2$ of about 0.5 mm to 3.0 mm, are provided on the FOUP sealing surface 25 such that the crests of the protuberances 23 oppose the FIMS 40. The protuberances 23 (having a height $H_2$) are brought into contact with the FIMS sealing surface 24, and the FOUP system 30 is held stationary at that position. In the area of the FOUP system 30 where the protuberance 23 is not present, the distance between the FIMS sealing surface 24 and the FOUP sealing surface 25 of the FOUP shell section 1 can be maintained to about 0.5 mm to 3.0 mm, which is equal to the height $H_2$ of the protuberances 23.

In the present embodiment, there can be embodied a FOUP structure, in which a contact switch may be provided on at least one of the protuberances 23 (having a thickness $H_2$) provided on the FOUP sealing surface 25. When the FIMS sealing surface 24 comes into contact with the contact switch provided on the protuberance 23 (having a height of $H_2$) provided on the FOUP sealing surface 25, the resultant contacted state is detected on the basis of a signal output from the contact switch, to thereby control docking action of the FOUP system 30; that is, bringing the FOUP sealing surface 25 of the FOUP system 30 into contact with the protuberances 23 (having a height $H_2$) provided on the FOUP sealing surface 25 of the FOUP system 30.

There is embodied a FOUP structure, in which the protuberance 23 (having a height $H_2$) formed on the FOUP sealing surface 25 according to the second embodiment is constructed so as to ensure flow of clean air from the mini-environment defined within the treatment unit 21 (the inside of the FIMS 40) to the outside thereof (the outside of the FIMS 40). More specifically, the FOUP system 30 is stopped at a position, in which the FOUP sealing surface 25 of the FOUP shell section 1 is in contact with the FIMS sealing surface 24. Thus, the FOUP system 30 can be stopped repeatedly at the same position with high precision, and hence the opening/closing of the FOUP door 2 can be controlled with high reliability.

At a position in which the FOUP system 30 is held stationary, a given clearance (having a height of 0.5 mm to 3.0 mm) which is equal to the height $H_2$ of the protuberances 23 provided on the FOUP sealing surface 25 can be ensured between the FOUP sealing surface 25 of the FOUP shell section 1 and the FIMS sealing surface 24, with the exception of the area where the protuberances 23 are in contact with the FIMS sealing surface 24. Thus, flow of clean air from the mini-environment defined within the treatment unit 21 (the inside of the FIMS 40) to the outside thereof (the outside of the FIMS 40) is not limited. Consequently, entry of particles (extraneous particles) into the FIMS 40 can be prevented with sufficient reliability.

Such a load port system employing the load port 13 and the FOUP system 30, enables a highly-reliable low-contamination production method for use with a system of manufacturing a semiconductor device.

As mentioned previously, in the present embodiment, there is provided a load port system for use with a substrate treatment unit, in which a plurality of protuberances to be brought into contact with a sealing surface provided around a door opening section of a wafer carrier, such as a FOUP, are provided on a sealing surface laid around the load port door of the substrate treatment unit.

According to the present embodiment, the following advantages are yielded. A first advantage is that the reliability of opening/closing action of the FOUP door 2 can be improved by means of providing the protuberances 23 (having a height $H_2$) on the FOUP sealing surface 25.

A second advantage is that, so long as there is embodied a load port structure, in which clean air is blown from the inside of the treatment unit 21 (the FIMS 40) to the FOUP system 30 by way of a clearance between the FIMS sealing surface 24 and the FOUP sealing surface 25, entry of particles (extraneous particles) into the treatment unit 21 (the inside of the FIMS 40) can be prevented with sufficient reliability. Consequently, integrated circuits can be produced at high yield.

Third Embodiment

A third embodiment of the present invention will be described in detail. Those elements which are the same as those previously described in the first and second embodiments are assigned the same reference numerals, and repetition of their explanations is omitted. The first and second embodiments have described the structure in which the protuberances 22 are provided on the FIMS sealing surface 24 and the structure in which the protuberances 23 are provided on the FOUP sealing surface 25. The present invention is not limited to these structures.

In the present embodiment, in addition to the structure of the FOUP system of the background art, the protuberances, that is the protuberances 22 (having a height $H_1$) provided on the FIMS sealing surface 24 and the protuberances 23 (having a height $H_2$) provided on the FOUP sealing surface 25, may be provided on both the FIMS sealing surface 24 and the FOUP sealing surface 25. In the case of docking action of the FOUP system 30 in which the FOUP sealing surface 25 of the FOUP system 30 (a side-door integral-type storage jig) is brought into contact with the protuberances 22 (having a height $H_1$) provided on the FIMS sealing surface 24 simultaneously with the protuberances 23 (having a height $H_2$) provided on the FOUP sealing surface 25 of the FOUP system 30 being brought into contact with the FIMS sealing surface 24, the positions of the protuberances 22 (having a height $H_1$) and the positions of the protuberances 23 (having a height $H_2$) must be determined so as to avoid occurrence of overlaps therebetween.

As mentioned above, according to the present embodiment, the following advantages are yielded. A first advantage is that the reliability of opening/closing action of the FOUP door 2 can be improved by means of providing the protuberances 22 (having a height $H_1$) on the FIMS sealing surface 24 and providing the protuberances 23 (having a height $H_2$) on the FOUP sealing surface 25.

A second advantage is that, so long as there are embodied a load port structure and a FOUP structure, in which clean air is blown from the inside of the treatment unit 21 (the FIMS 40) to the FOUP system 30 by way of a clearance between the FIMS sealing surface 24 and the FOUP sealing surface 25, entry of particles (extraneous particles) into the treatment unit 21 (the inside of the FIMS 40) can be prevented with sufficient reliability. Consequently, integrated circuits can be produced at high yield.

The wafers (substrates) described in connection with the previous embodiments are not limited to a wafer to be used for fabricating a semiconductor device. The wafers broadly cover substrates for photo-reticle, substrates for display panels such as substrates for liquid-crystal displays or plasma displays, substrates for hard disk, and glass substrates, magnetic substrates, or resin substrates for use as substrates such as wafers for fabricating electronic devices such as semiconductor devices.

The previous embodiments can be applied to a FOUP structure to be employed for a FOUP system 30 which holds, transports, and stores such wafers (substrates), the load port structure of the FIMS 40 using such a FOUP system 30, and a manufacturing method using the FOUP structure and the load port structure.

The present invention is not limited to these embodiments. It is obvious that the present invention is susceptible to various modifications within the scope of the invention. The number, position, and geometry of constituent elements are not limited to those described in connection with the embodiments. The number, position, and geometry of elements which are suitable for carrying out the invention can be employed.

The aspects of the present invention may be summarized in another expression as follows:

According to one aspect of the present invention, the load port structure according to the present invention has a load port mechanism for opening/closing a FOUP, which is a next-generation substrate carrier for holding, transporting, and storing substrates. Protuberances are provided on a FIMS sealing surface so as to be oppose a FOUP system and not to prevent flow of clean air from a mini-environment in a substrate treatment unit (FIMS) to the outside thereof (i.e., the outside of the FIMS). The height of the protuberances is for separating a FOUP sealing surface of the FOUP system from a FIMS sealing surface by only a predetermined distance.

In another aspect of the present invention, in the load port structure, the FOUP system is held stationary in a position where protuberances provided on the FIMS sealing surface are brought into contact with the FOUP sealing surface of the FOUP shell section.

In another aspect of the present invention, in the load port structure, contact surfaces of protuberances are brought into contact with the FOUP sealing surface of the FOUP shell section, and the FOUP system is held stationary at that position. In the area of the FOUP system where protuberances are not provided, the FIMS sealing surface is separated from the FOUP sealing surface of the FOUP shell section by a distance equal to the height of the protuberances.

In another aspect of the present invention, in the load port structure, a contact switch is provided on at least one of the protuberances provided on the FIMS sealing surface. When the FOUP system is brought into contact with the contact switch provided on the protuberance on the FIMS sealing surface, the resultant state of contact is detected on the basis of a signal output from the contact switch, thereby controlling docking action of the FOUP system.

According to another aspect of the present invention, a FOUP structure has a load port mechanism for opening/closing a FOUP, which is a next-generation substrate carrier for holding, transporting, and storing substrates. Protuberances are provided on a FIMS sealing surface so as to oppose a FIMS and not to prevent flow of clean air from a mini-environment in a substrate treatment unit (FIMS) to the outside thereof (i.e., the outside of the FIMS). The height of the protuberances is to separate a FOUP sealing surface of the FOUP system from a FIMS sealing surface by only a predetermined distance.

In another aspect of the present invention, in the FOUP structure, the FOUP system is held stationary in a position where protuberances provided on the FOUP sealing surface are brought into contact with the FIMS sealing surface.

In another aspect of the present invention, in the FOUP structure, contact surfaces of protuberances are brought into contact with the FIMS sealing surface, and the FOUP system is held stationary at that position. In the area of the FOUP system where protuberances are not provided, the FIMS sealing surface is separated from the FOUP sealing surface of the FOUP shell section by a distance equal to the height of the protuberances.

In another aspect of the present invention, in the FOUP structure, a contact switch is provided on at least one of the protuberances provided on the FOUP sealing surface. When the FIMS sealing surface is brought into contact with the contact switch provided on the protuberance on the FOUP sealing surface, the resultant sate of contact is detected on the basis of a signal output from the contact switch, thereby controlling docking action of the FOUP system.

The present invention is embodied in the manner as mentioned above, and the present invention yields the following advantages.

A first advantage is that the reliability of opening/closing action of a FOUP door can be improved by means of providing protuberances on a FIMS sealing surface or providing protuberances on a FOUP sealing surface.

A second advantage is that, so long as there is embodied a structure in which clean air is blown from the inside of a treatment unit (an FIMS) to a FOUP system by way of a clearance between a FIMS sealing surface and a FOUP sealing surface, entry of particles (extraneous particles) into the treatment unit (the inside of the FIMS) can be prevented with sufficient reliability. Consequently, integrated circuits can be produced at high yield.

It is further understood that the foregoing descriptions are preferred embodiments of the present invention and that various changes and modifications may be made in the invention without departing from the spirit and scope thereof.

The entire disclosure of a Japanese Patent Application No. 11-334104, filed on Nov. 25, 1999 including specification, claims, drawings and summary, are incorporated herein by reference in its entirety.

What is claimed is:

1. A load port system for use with a substrate treatment unit, in which, when a wafer carrier is placed on a load port of the substrate treatment unit, a load port door opposes a door of the wafer carrier, and a sealing surface provided around the load port door opposes a sealing surface provided around a door opening section of the wafer carrier, wherein a plurality of protuberances to be brought into contact with the sealing surface provided around the door opening section of the wafer carrier are provided on the sealing surface formed around the load port door of the substrate treatment unit, and a predetermined clearance is maintained between the sealing surface provided around the load port door and the sealing surface provided around the door opening section of the wafer carrier.

2. The load port system as defined in claim 1, wherein at least one of the plurality of protuberances is formed into a contact switch, and there is provided means for controlling docking action of the wafer carrier in accordance with a contact signal.

3. The load port system as defined in claim 1, wherein the height of the protuberances ranges from 0.5 mm to 3.0 mm.

4. A method of treating a substrate using the load port system for a substrate treatment unit as defined in claim 1.

5. The method as defined in claim 4, wherein clean air is blown from the inside of the substrate treatment unit by way of a predetermined clearance between the sealing surface provided around the load port door and the sealing surface provided around the door opening section of the wafer carrier.

6. A load port system for use with a substrate treatment unit, in which, when a wafer carrier is placed on a load port of the substrate treatment unit, a load port door opposes a door of the wafer carrier, and a sealing surface provided around the load port door opposes a sealing surface provided around a door opening section of the wafer carrier, wherein a plurality of protuberances to be brought into contact with the sealing surface provided around the load port door of the substrate treatment unit are provided on the sealing surface formed around the door opening section of the wafer carrier, and a predetermined clearance is maintained between the sealing surface provided around the load port door and the sealing surface provided around the door opening section of the wafer carrier.

7. The load port system as defined in claim 6, wherein at least one of the plurality of protuberances is formed into a contact switch, and there is provided means for controlling docking action of the wafer carrier in accordance with a contact signal.

8. The load port system as defined in claim 6, wherein the height of the protuberances ranges from 0.5 mm to 3.0 mm.

9. A method of treating a substrate using the load port system for a substrate treatment unit as defined in claim 6.

10. The method as defined in claim 9, wherein clean air is blown from the inside of the substrate treatment unit by way of a predetermined clearance between the sealing surface provided around the load port door and the sealing surface provided around the door opening section of the wafer carrier.

11. A method of treating a substrate, comprising the steps of:

placing a wafer carrier at a position on a load port of a substrate treatment unit;

directing a sealing surface provided around a load port door so as to oppose a sealing surface provided around a door opening section of the wafer carrier; and bringing a protuberance provided on the sealing surface formed around the load port door or a protuberance provided on the sealing surface formed around the door opening section of the wafer carrier into contact with a counterpart sealing surface, thereby separating the sealing surface formed around the load port door from the sealing surface formed around the door opening section of the wafer carrier by a predetermined clearance.

12. A load port system for use with a substrate treatment unit, in which a wafer carrier having wafers stored therein is placed on a load port of the substrate treatment unit, a load port door opposes a door of the wafer carrier, and a sealing surface provided around the load port door opposes a sealing surface provided around a door opening section of the wafer carrier, wherein a plurality of proturberances to be brought into contact with the sealing surface provided around the door opening section of the wafer carrier are provided on the sealing surface formed around the load port door of the substrate treatment unit, and a predetermined clearance is maintained between the sealing surface provided around the load port door and the sealing surface provided around the door opening section of the wafer carrier.

13. A load port system for use with a substrate treatment unit, in which a wafer carrier having wafers stored therein is placed on a load port of the substrate treatment unit, a load port door opposes a door of the wafer carrier, and a sealing surface provided around the load port door opposes a sealing surface provided around a door opening section of the wafer carrier, wherein a plurality of proturberances to be brought into contact with the sealing surface provided around the load port door of the substrate treatment unit are provided on the sealing surface formed around the door opening section of the wafer carrier, and a predetermined clearance is maintained between the sealing surface provided around the load port door and the sealing surface provided around the door opening section of the wafer carrier.

* * * * *